(12) United States Patent
Furukawa et al.

(10) Patent No.: US 6,967,313 B1
(45) Date of Patent: Nov. 22, 2005

(54) HOT PLATE AND METHOD OF PRODUCING THE SAME

(75) Inventors: Masakazu Furukawa, Gifu (JP); Yoshiyuki Ido, Gifu (JP)

(73) Assignee: Ibiden Company, Ltd., Ogaki (JP)

( * ) Notice: Subject to any disclaimer, the term of this patent is extended or adjusted under 35 U.S.C. 154(b) by 0 days.

(21) Appl. No.: 09/926,465

(22) PCT Filed: Apr. 27, 2000

(86) PCT No.: PCT/JP00/02749

§ 371 (c)(1),
(2), (4) Date: Feb. 12, 2002

(87) PCT Pub. No.: WO00/69219

PCT Pub. Date: Nov. 16, 2000

(30) Foreign Application Priority Data

May 7, 1999 (JP) ................... 11-126975

(51) Int. Cl.[7] ................................ H05B 3/68
(52) U.S. Cl. ..................... 219/465.1; 219/541
(58) Field of Search ............ 219/444.1, 465.1, 219/466.1, 543, 544, 546, 547, 548, 445.1, 219/446.1, 447.1, 448.13, 448.19, 460.1, 219/462.1, 509, 518, 541, 542; 347/204, 347/205; 257/781; 118/724, 725; 338/307–309, 338/324, 327, 328

(56) References Cited

U.S. PATENT DOCUMENTS

| | | | |
|---|---|---|---|
| 3,579,722 A | * | 5/1971 | Fennimore et al. ......... 425/4 R |
| 3,883,719 A | * | 5/1975 | Hurko ..................... 219/466.1 |
| 4,574,292 A | * | 3/1986 | Takikawa et al. .......... 347/204 |
| 4,804,823 A | * | 2/1989 | Okuda et al. ............... 219/553 |
| 5,118,983 A | * | 6/1992 | Morita et al. ............... 313/340 |
| 5,151,871 A | * | 9/1992 | Matsumura et al. ........ 700/300 |
| 5,442,239 A | * | 8/1995 | DiGiacomo et al. ........ 257/781 |
| 5,554,839 A | * | 9/1996 | Tsuruta et al. .............. 219/544 |
| 5,560,851 A | * | 10/1996 | Thimm et al. .............. 219/543 |
| 5,643,483 A | * | 7/1997 | Kubota et al. .............. 219/543 |
| 6,080,970 A | * | 6/2000 | Yoshida et al. .......... 219/444.1 |
| 6,133,557 A | * | 10/2000 | Kawanabe et al. ......... 219/544 |
| 6,465,763 B1 | | 10/2002 | Ito et al. |
| 6,475,606 B2 | | 11/2002 | Niwa |
| 6,507,006 B1 | | 1/2003 | Hiramatsu et al. |
| 2002/0043527 A1 | | 4/2002 | Ito |
| 2002/0055021 A1 | | 5/2002 | Niwa |
| 2003/0015521 A1 | | 1/2003 | Ito |
| 2004/0035846 A1 | | 2/2004 | Hiramatsu et al. |
| 2004/0149723 A1 | | 8/2004 | Furukawa et al. |

FOREIGN PATENT DOCUMENTS

| | | |
|---|---|---|
| JP | 56-88319 | 7/1981 |
| JP | 59-165395 | 9/1984 |
| JP | 61-10893 | 1/1986 |
| JP | 62-167396 | 10/1987 |

(Continued)

OTHER PUBLICATIONS

U.S. Appl. No. 09/673,953, filed Dec. 21, 2000, Ito et al.

(Continued)

*Primary Examiner*—Sang Paik
(74) *Attorney, Agent, or Firm*—Oblon, Spivak, McClelland, Maier & Neustadt, P.C.

(57) ABSTRACT

An object to provide a hot plate making it possible to heat an object to be heated uniformly, and the hot plate of the present invention is characterized in that a resistance element having a thickness dispersion of ±3 μm or less is formed on an insulating substrate.

30 Claims, 4 Drawing Sheets

FOREIGN PATENT DOCUMENTS

| | | |
|---|---|---|
| JP | 1315903 | 12/1989 |
| JP | 3-182087 | 8/1991 |
| JP | 9-139278 | 5/1997 |
| JP | 11-40330 | 2/1999 |
| JP | 11-251040 | 9/1999 |

OTHER PUBLICATIONS

U.S. Appl. No. 09/806,477, filed Jun. 25, 2001, Ito et al.
U.S. Appl. No. 10/346,095, filed Jan. 17, 2003, Ito et al.
U.S. Appl. No. 10/048,490, filed Apr. 30, 2002, Ito et al.
U.S. Appl. No. 09/524,010, filed Mar. 13, 2000, Niwa.
U.S. Appl. No. 09/946,463, filed Sep. 6, 2001, Niwa.
U.S. Appl. No. 10/244,008, filed Sep. 16, 2002, Niwa.
U.S. Appl. No. 10/670,354, filed Sep. 26, 2003, Niwa.
U.S. Appl. No. 10/168,527, filed Jun. 28, 2002, Hiramatsu et al.
U.S. Appl. No. 09/831,887, filed May 23, 2001, Ito et al.
U.S. Appl. No. 10/387,452, filed Mar. 14, 2003, Ito et al.
U.S. Appl. No. 10/069,943, filed Jul. 10, 2002, Ito et al.
U.S. Appl. No. 10/732,296, filed Dec. 11, 2003, Ito et al.
U.S. Appl. No. 10/277,818, filed Oct. 23, 2002, Hiramatsu et al.
U.S. Appl. No. 09/807,960, filed May 18, 2001, Hiramatsu et al.
U.S. Appl. No. 10/229,177, filed Aug. 28, 2002, Hiramatsu et al.
U.S. Appl. No. 10/049,293, filed Apr. 30, 2002, Ito et al.
U.S. Appl. No. 10/226,160, filed Aug. 23, 2002, Ito et al.
U.S. Appl. No. 09/806,478, filed Jul. 26, 2001, Ito et al.
U.S. Appl. No. 09/926,092, filed Dec. 27, 2001, Ito et al.
U.S. Appl. No. 10/618,651, filed Jul. 15, 2003, Ito et al.
U.S. Appl. No. 10/618,623, filed Jul. 15, 2003, Ito et al.
U.S. Appl. No. 10/618,655, filed Jul. 15, 2003, Ito et al.
U.S. Appl. No. 10/618,665, Jul. 15, 2003, Ito et al.
U.S. Appl. No. 09/869,321, Oct. 18, 2001, Zhou.
U.S. Appl. No. 09/926,012, Oct. 24, 2001, Hiramatsu et al.
U.S. Appl. No. 10/352,138, Jan. 28, 2003, Hiramatsu et al.
U.S. Appl. No. 10/260,360, Oct. 1, 2002, Niwa.
U.S. Appl. No. 09/926,297, filed Dec. 26, 2001, Hiramatsu et al.
U.S. Appl. No. 10/746,081, Dec. 29, 2003, Hiramatsu et al.
U.S. Appl. No. 09/926,296, Dec. 27, 2001, Ito et al.
U.S. Appl. No. 09/926,362, Jan. 16, 2002, Hiramatsu et al.
U.S. Appl. No. 10/442,967, filed May 22, 2003, Hiramatsu et al.
U.S. Appl. No. 09/926,464, Jan. 10, 2002, Hiramatsu et al.
U.S. Appl. No. 09/926,499, filed Mar. 26, 2002, Hiramatsu et al.
U.S. Appl. No. 10/386,615, Mar. 13, 2003, Hiramatsu et al.
U.S. Appl. No. 10/088,100, Jun. 26, 2002, Ido.
U.S. Appl. No. 09/926,714, filed Dec. 6, 2001, Ito et al.
U.S. Appl. No. 10/009,174, filed Apr. 21, 2003, Hiramatsu et al.
U.S. Appl. No. 09/926,713, Mar. 5, 2002, Hiramatsu.
U.S. Appl. No. 10/619,567, Jul. 16, 2003, Hiramatsu et al.
U.S. Appl. No. 09/926,800, filed Mar. 19, 2002, Hiramatsu et al.
U.S. Appl. No. 10/615,950, filed Jul. 10, 2003, Hiramatsu et al.
U.S. Appl. No. 10/311,368, Dec. 16, 2002, Ito et al.
U.S. Appl. No. 10/416,497, May 19, 2003, Hiramatsu et al.
U.S. Appl. No. 10/019,280, Apr. 22, 2002, Ito et al.
U.S. Appl. No. 10/697,287, Oct. 31, 2003, Ito et al.
U.S. Appl. No. 10/019,448, Apr. 8, 2002, Ito et al.
U.S. Appl. No. 10/019,444, Apr. 23, 2002, Hiramatsu et al.
U.S. Appl. No. 10/019,311, Apr. 9, 2002, Hiramatsu et al.
U.S. Appl. No. 10/397,321, Mar. 27, 2003, Hiramatsu et al.
U.S. Appl. No. 10/030,123, May 16, 2002, Hiramatsu et al.
U.S. Appl. No. 10/718,535, Nov. 24, 2003, Hiramatsu et al.
U.S. Appl. No. 10/343,747, Feb. 6, 2003, Ito et al.
U.S. Appl. No. 10/048,979, Apr. 26, 2002, Hiramatsu et al.
U.S. Appl. No. 10/048,989, May 29, 2002, Hiramatsu et al.
U.S. Appl. No. 10/069,511, Jun. 24, 2002, Ito et al.
U.S. Appl. No. 10/069,510, Jun. 20, 2002, Hiramatsu et al.
U.S. Appl. No. 10/070,443, Jun. 24, 2002, Hiramatsu et al.
U.S. Appl. No. 10/070,441, Jun. 26, 2002, Ito et al.
U.S. Appl. No. 10/088,098, May 30, 2002, Ito et al.
U.S. Appl. No. 10/362,941, Apr. 28, 2003, Ito.
U.S. Appl. No. 10/111,980, Apr. 30, 2002, Ito et al.
U.S. Appl. No. 10/181,724, Jul. 22, 2002, Hiramatsu et al.
U.S. Appl. No. 10/343,833, Feb. 10, 2003, Zhou et al.
U.S. Appl. No. 10/344,148, Feb. 10, 2003, Kariya et al.
U.S. Appl. No. 10/398,393, Apr. 7, 2003, Hiramatsu et al.
U.S. Appl. No. 10/473,585, Oct 9, 2003, Ito.
U.S. Appl. No. 10/363,310, filed Mar. 3, 2003, Ito.
U.S. Appl. No. 10/432,639, filed Jun. 10, 2003, Ito et al.
U.S. Appl. No. 09/462,067, filed Jan. 5, 2001, Furukawa et al.
U.S. Appl. No. 09/471,759, filed Dec. 23, 1999, Saito et al.
U.S. Appl. No. 09/787,816, filed Mar. 23, 2001, Ito.
U.S. Appl. No. 09/917,749, filed Jul. 31, 2001, Ito.
U.S. Appl. No. 09/787,954, filed Mar. 23, 2001, Ito.
U.S. Appl. No. 10/345,356, filed Jan. 16, 2003, Ito.
U.S. Appl. No. 09/787,818, filed Mar. 23, 2001, Ito.
U.S. Appl. No. 09/915,418, filed Jul. 27, 2001, Ito.
U.S. Appl. No. 10/356,519, filed Feb. 3, 2003, Ito.
U.S. Appl. No. 10/217,029, filed Aug. 13, 2002, Ito.
U.S. Appl. No. 09/979,676, filed Nov. 5, 2001, Zhou.
U.S. Appl. No. 10/049,539, filed Nov. 7, 2001, Zhou.
U.S. Appl. No. 10/048,894, filed Feb. 1, 2002, Furukawa.
U.S. Appl. No. 09/806,957, filed Apr. 6, 2001, Ito et al.
U.S. Appl. No. 09/890,358, filed Jul. 30, 2001, Ito.
U.S. Appl. No. 09/916,682, filed Jul. 30, 2001, Ito.
U.S. Appl. No. 10/222,928, filed Aug. 19, 2002, Ito.
U.S. Appl. No. 10/182,009, filed Jul. 24, 2002, Zhou.
U.S. Appl. No. 09/958,689, filed Oct. 10, 2001, Furukawa et al.
U.S. Appl. No. 09/926,730, filed Apr. 16, 2001, Hiramatsu et al.
U.S. Appl. No. 10/265,413, filed Oct. 7, 2002, Ohashi et al.
U.S. Appl. No. 09/880,742, filed Jun. 13, 2001, Saito et al.
U.S. Appl. No. 09/880,359, filed Jun. 13, 2001, Saito et al.
U.S. Appl. No. 09/880,379, filed Jun. 13, 2001, Saito et al.
U.S. Appl. No. 09/926,465, filed Feb. 12, 2002, Furukawa et al.
U.S. Appl. No. 10/766,027, filed Jan. 29, 2004, Ito et al.
U.S. Appl. No. 10/876,665, filed Jun. 28, 2004, Ito et al.
U.S. Appl. No. 10/901,109, filed Jul. 29, 2004, Hiramatsu et al.
U.S. Appl. No. 10/900,113, filed Jul. 28, 2004, Hiramatsu et al.
U.S. Appl. No. 10/943,974, filed Sep. 20, 2004, Ito et al.
U.S. Appl. No. 10/928,146, filed Aug. 30, 2004, Hiramatsu et al.
U.S. Appl. No. 10/921,992, filed Aug. 20, 2004, Hiramatsu et al.
U.S. Appl. No. 10/842,482, filed May 11, 2004, Zhou.

U.S. Appl. No. 10/858,044, filed Jun. 2, 2004, Hiramatsu et al.

U.S. Appl. No. 10/916,405, filed Aug. 12, 2004, Hiramatsu et al.

U.S. Appl. No. 10/918,351, filed Aug. 16, 2004, Ito et al.

U.S. Appl. No. 10/921,271, filed Aug. 19, 2004, Hiramatsu.

* cited by examiner (a)
Ra=0.5

(b)
Ra=0.1

(c)
Ra=0.03

(a) Perpendicular to the printing direction (b) Parallel to the printing direction

HOT PLATE AND METHOD OF PRODUCING THE SAME

FIELD OF THE INVENTION

The present invention relates to a hot plate and a process for producing the same.

BACKGROUND ART

In the case that, for example, a silicon wafer subjected to a photosensitive resin applying step is heated and dried in a process for producing a semiconductor, a heating device called a hot plate is usually used. Conventionally, such a hot plate has a structure a resistance element is arranged on the lower face side of a ceramic substrate. Such a resistance element is formed using, for example, silver paste. Specifically, in the state that a mask for screen printing is set up, silver paste is printed on a substrate through openings in the mask by moving a squeegee in a given direction. After the mask is taken off, the printed paste layer is heated so that a resistance element having a given pattern is baked on the substrate (for example, Japanese Kokai Publication Hei 11-40330 (1999) and so on).

When a hot plate is used, a silicon wafer, which is an object to be heated, is put on the upper surface of the hot plate. By sending an electric current to its resistance element in this state, the resistance element generates heat to heat the whole of the silicon wafer.

SUMMARY OF THE INVENTION

Incidentally, for a hot plate, the performance of heating a silicon wafer uniformly is required in order to reduce dispersion in temperature inside the silicon wafer to a minimum. In spite of this, the above mentioned conventional hot plate does not have the performance of generating uniform heat that satisfies a level required in recent years. In the present situation, even a cause that the performance of generating uniform heat deteriorates is not necessarily clear. Thus, in the case that the diameter of silicon wafers becomes still larger hereafter, silicon wafers having a high quality cannot be produced even if the above mentioned hot plate is used.

Thus, the inventors made eager investigation for clearing up the cause that the performance of generating uniform heat deteriorates. As a result, the following unexpected finding has been obtained.

Namely, in a screen printing step of silver paste, in the state that a mask is set up, a squeegee is moved to print the silver paste, and subsequently the mask is taken off from the substrate. At this time of taking off, the silver paste adheres to the mask. Thus, if the mask is taken off in the state that the drying of the paste is unfinished, a portion of the silver paste adheres to the mask. For this reason, the surface of the printed paste layer becomes rough so that dispersion in the thickness of the resistance element gets large. As a result, the dispersion in the value of resistivity inside the resistance element increases so that dispersion in the calorific value inside the resistance element increases. It has been found out that this fact is a main cause that the performance of generating uniform heat deteriorates.

Graphs of FIGS. 5(a) and 5(b) show data obtained when a resistance element was measured with a stylus type surface roughness meter in order to demonstrate the state that distribution of the thickness of the resistance element is generated. It can be understood from FIGS. 5(a) and (b) that the thickness dispersion is more remarkably generated in the portion perpendicular to the printing direction (that is, the direction along which the squeegee moves) than in the portion parallel to this direction.

Thus, the inventors have considered that if the dispersion in the thickness of the resistance element is made small, the performance of generating uniform heat can be improved. As a result, the inventors have got the idea on the present invention as described below. That is, an object of the present invention is to provide a hot plate making it possible to heat an object to be heated uniformly, and a process for producing the hot plate.

In order to solve the above mentioned problems, a subject matter of a first aspect of the present invention is a hot plate wherein a resistance element having a thickness dispersion of ±3 $\mu$m or less and preferably ±1 $\mu$m or less is formed on an insulating substrate.

In the present specification, the thickness dispersion is defined as follows. When the surface of the insulating substrate is set to a zero point and a surface roughness curve of the surface of the resistance element is drawn with a stylus type surface roughness meter, this curve represents the thickness. Thus, along this curve, 10 points are arbitrarily selected. Average thickness Tav can be obtained by averaging them. The maximum thickness at the measured points is defined as Tmax, and the minimum thickness at the measured points is defined as Tmin. The larger value between the absolute value of Tmax−Tav and that of Tmin−Tav is defined as a dispersion. In the case that the absolute value of Tmin−Tav is larger one, the symbol "~" is attached to the value of a dispersion. The Tmin−Tav does not exceed the average thickness Tav.

In the first aspect of the present invention, the thickness of the resistance element is desirably from 0.5 to 500 $\mu$m, and more desirably from 1 to 10 $\mu$m. The surface roughness Ra of the insulating substrate surface on which a resistance element is formed is desirably 2.0 $\mu$m or less and more desirably 1 $\mu$m or less. The above mentioned insulating substrate is desirably a nitride ceramic substrate or a carbide ceramic substrate.

In the first aspect of the present invention, the resistance element is desirably made of scaly noble metal powder. It is also desirable that the resistance element has a multilayer structure and the layer nearest to the substrate among a plurality of the layers constituting the resistance element is made of titanium or chromium.

In the first aspect of the present invention, the resistance element is desirably composed of a first layer made of titanium, a second layer made of molybdenum and having a larger thickness than the first layer, on the first layer, and a third layer made of nickel and having an intermediate thickness between the thickness of the first layer and that of the second layer, on the second layer. The resistance element is preferably composed of a titanium layer having a thickness of 0.1 to 0.5 $\mu$m, a molybdenum layer having a thickness of 0.5 to 7.0 $\mu$m, on the titanium layer, and a nickel layer having a thickness of 0.4 to 2.5 $\mu$m on the molybdenum layer.

A second aspect of the present invention is a process for producing a hot plate wherein a resistance element having a thickness dispersion of ±3 $\mu$m or less is formed on an insulating substrate, characterized by forming a resistance element by a film-depositing method based on a dry process.

In the second aspect of the present invention, the resistance element is desirably formed by RF sputtering.

The subject matter of a third present invention is a process for producing a hot plate wherein a resistance element having a thickness dispersion of ±3 µm or less is formed on an insulating substrate, which is characterized by printing a resistance element paste made of scaly noble metal powder and firing the paste.

The "effect" of the present invention will be described hereinafter.

According to the first aspect of the present invention, the thickness dispersion of the resistance element formed on the insulating substrate is ±3 µm or less, and is smaller than that of conventional hot plates. For this reason, the dispersion in the value of resistivity inside the resistance element becomes small. As a result, the dispersion in the calorific value inside the resistance element becomes small, so that an object to be heated can be uniformly heated. The inventors have obtained the finding from tests that by setting the surface roughness Ra of the ceramic substrate surface on which a resistance element is formed to 2.0 µm or less and desirably 1.0 µm or less, the thickness dispersion of the resistance element can be further reduced.

According to the second aspect of the present invention, in the case of the film-depositing method based on a dry process, the thickness dispersion of the formed resistance element becomes small. The resistance element becomes denser than resistance elements obtained by any film-depositing method based on a wet process, such as plating. Accordingly, the dispersion in the value of resistivity inside the resistance element becomes small. As a result, the dispersion in the calorific value inside the resistance element becomes small. In short, when the production process of the present invention is carried out, a hot plate having the above mentioned superior properties can be easily and surely produced.

If RF sputtering, which is one of physical film-depositing methods, is adopted in this case, the resistance element is made still denser so that inner defects are not easily generated in the resistance element. As a result, the dispersion in the value of resistivity becomes very small. Adhesiveness of the resistance element to the substrate also becomes very high so that a resistance element that is not easily exfoliated can be obtained.

According to the third aspect of the present invention, even if a film-depositing method based on a wet process is adopted, a resistance element having a small thickness dispersion can be obtained by printing a resistance element paste made of scaly noble metal powder and firing the paste. The scaly noble powder is oriented when the paste is printed; therefore, the powder does not easily adhere to the mask so that the dispersion in the thickness of the resistance element becomes small.

EXPLANATION ON SYMBOLS 3 hot plate
3b lower face of the surface on which resistance element is formed
9 insulating substrate (aluminum nitride substrate)
10 resistance element
15 first layer (titanium layer)
16 second layer (molybdenum layer)
17 third layer (nickel layer)

DETAILED DISCLOSURE OF THE INVENTION

Referring to FIGS. 1 to 4, embodiments of the hot plate unit of the present invention will be specifically described hereinafter.

Figure 1:
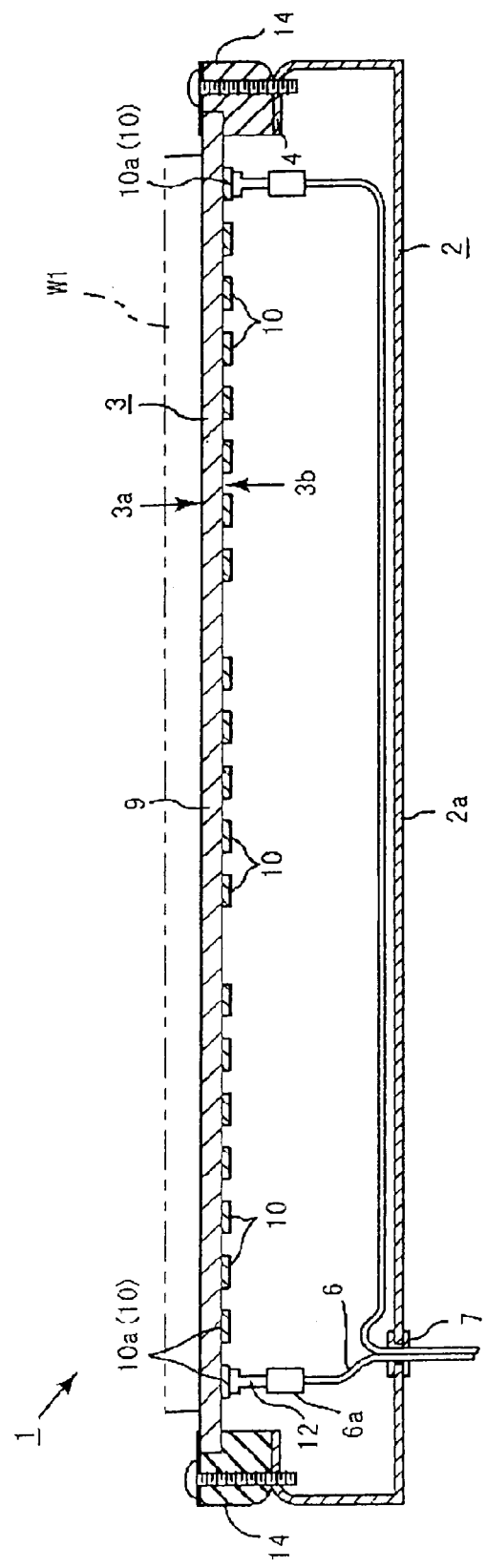
FIG. 1 is a general cross section view that schematically shows a hot plate unit according to an embodiment of the present invention.

FIG. 1 is a cross section view that schematically shows an embodiment of the hot plate unit of the present invention.

This hot plate unit 1 has a casing 2 and a hot plate 3 as main constituents.

The casing 2 is a member made of a metal and having a bottom. The casing 2 has at its upper side an opening 4 having a circular section. The hot plate 3 is fitted into this opening 4 through an annular seal ring 14. A lead wire pulling-out hole 7, into which lead wires 6 for supplying an electric current are inserted, is made in the outer peripheral portion of a bottom 2a of the casing 2. The respective lead wires 6 are pulled out from the hole to the outside of the casing 2.

This hot plate 3 is a hot plate for low temperature, which is a member for drying a silicon wafer W1 at 150 to 200° C., onto which a photosensitive resin is applied. The hot plate 3 is made of a nitride ceramic substrate (specifically, aluminum nitride substrate) 9 which is an insulating substrate. The reason why aluminum nitride is selected as the material for the hot plate is that aluminum nitride has a higher thermal conductivity than other ceramics and is very advantageous for an improvement in the performance of generating uniform heat.

As the nitride ceramic, silicon nitride, boron nitride and the like may be used. Instead of the nitride ceramic, carbide ceramic such as silicon carbide, titanium carbide or boron carbide may be used.

Also, if the hot plate is for low temperature, it is unnecessary that its insulating plate is made of a ceramic. A resin plate, such as an epoxy resin plate or a polyimide plate may be used.

If a ceramic is used as the insulating substrate in the hot plate of the present invention, the hot plate can be used not only at low temperature but also at 200 to 800° C.

The insulating substrate 9 made of aluminum nitride according to the present embodiment is a disk-like member having a thickness of about 1 to 100 mm, and is designed in the manner that its diameter is somewhat smaller than the outer size of the casing 2.

Figure 2:
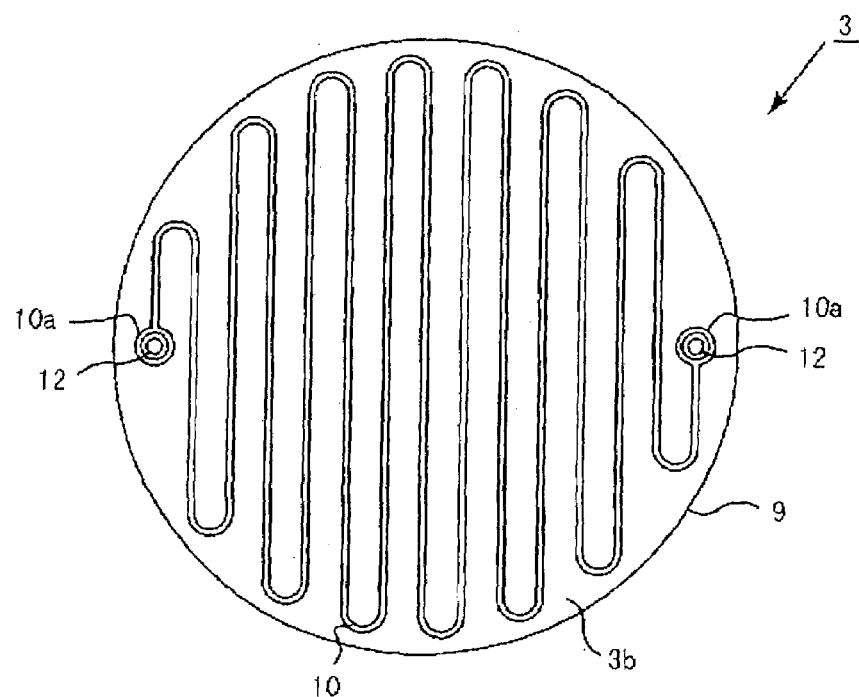
FIG. 2 is a general bottom plain view of the hot plate according to the embodiment.
Figure 3:
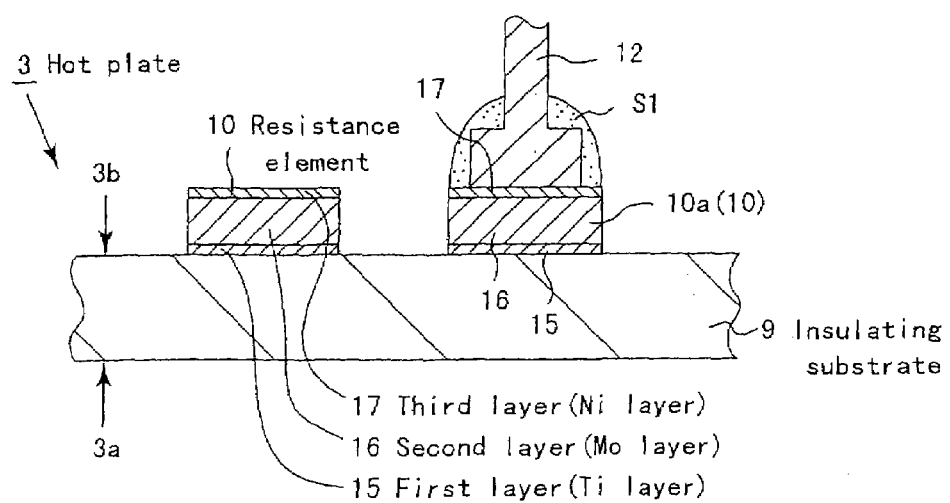
FIG. 3 is an enlarged cross section view of a main portion of the hot plate according to the embodiment.
Figure 4:
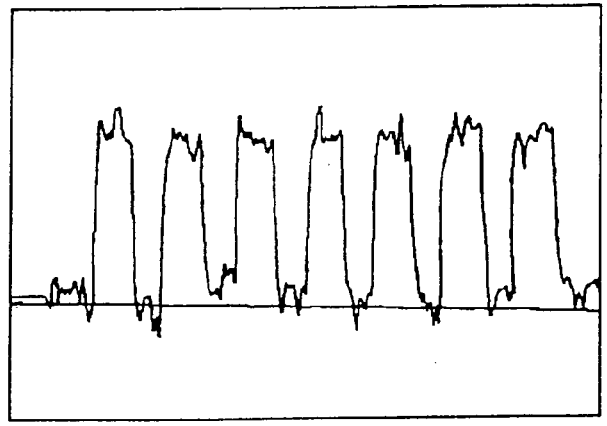
FIGS. 4(a) to (c) are graphs showing measurement results of the Ra values of hot plates of respective examples.
Figure 4:
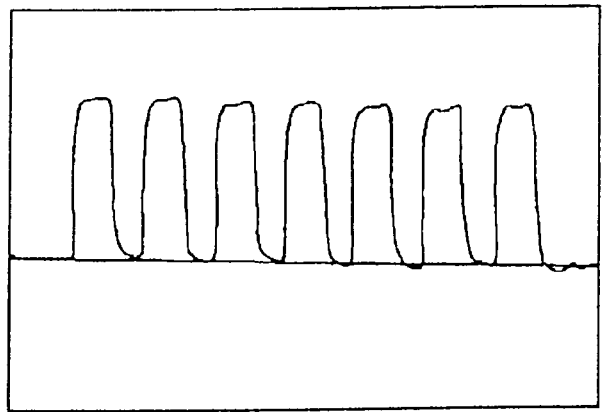
Figure 4:
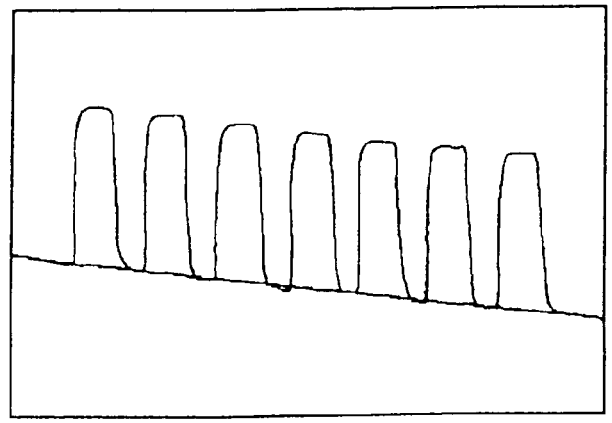

FIG. 2 is a bottom plain view showing the lower face of the insulating substrate 9 made of aluminum nitride, and FIG. 3 is a cross section view that schematically showing a part thereof.

As shown in FIG. 2, a resistance element 10 having a thickness distribution of ±3 µm or less is made into a given pattern on the surface on which a resistance element is formed (that is, a lower face) 3b of the insulating substrate 9 made of aluminum nitride. In the case of this insulating substrate 9, the resistance element 10 meanders on the whole of the lower face 3b. The width of the pattern of the resistance element 10 is uniform and the value thereof is set to 500 µm. Circular pads 10a for connecting a pin are made at both ends of the resistance element 10 and terminals pins 12 are connected thereto.

The surface roughness Ra of the lower face of the aluminum nitride substrate 9 is desirably 2.0 µm or less, more desirably 1.0 µm or less, still more desirably 0.5 µm or less, and most desirably 0.1 µm or less. This is because the inventors have obtained the finding from tests that the thickness dispersion of the resistance element 10 can be reduced by making the surface roughness Ra of the lower face 3b small. On the other hand, it is presumed that if the surface roughness Ra of the lower face 3b is too large, unevenness at the lower face 3b side of the insulating substrate 9 made of aluminum nitride influences the resistance element 10 so that unevenness is easily appeared in the upper face of the resistance element 10.

As shown in FIG. 3, the resistance element 10 according to the present invention has a multilayer structure (specifically, a 3-layer structure). Respective layers 15, 16 and 17 are thin metal layers made by sputtering, which is one of physical film-depositing methods. All of these thin metal layers are desirably made of a conductive metal.

The first layer 15 is formed to adhere closely to the lower face 3b of the aluminum nitride substrate 9. The second layer 16 is formed on the first layer 15 and the third layer 17 is formed on the second layer 16. In other words, the first layer 15 is a lowermost layer, the third layer 17 is an uppermost layer, and the second layer 16 is a layer positioned in the middle of the two layers 15 and 17.

In the case of the present embodiment wherein the aluminum nitride substrate 9 is selected, the first layer 15 positioned nearer to the insulating substrate 9, among the three layers 15, 16 and 17 constituting the resistance element 10, is desirably made of titanium or chromium. Furthermore, the first layer 15 is more preferably made of titanium having a thickness of 0.1 to 0.5 µm. This is because titanium has superior adhesiveness onto a nitride ceramic such as aluminum nitride and makes it possible to improve the adhesive strength as the whole of the resistance element 10. If the titanium layer (Ti layer) which is the first layer 15 is too thin, it is feared that the adhesiveness cannot be sufficiently improved. On the other hand, if the first layer (Ti layer) 15 is too thick, the adhesiveness is suitably improved but it is feared that productivity drops or costs rise.

The metal material making the third layer 17 is desirably nickel. The reasons why nickel is selected are as follows. First, by coating with nickel, the surface of the resistance element 10 is prevented from being oxidized so that the dispersion in the value of resistivity can be still more reduced. Second, solder adheres easily to nickel; therefore, nickel is suitable for the case in which the nickel will be connected to pins afterward.

In the above mentioned case, the thickness of the nickel layer (Ni layer), which is the third layer, is desirable an intermediate thickness between that of the first layer 15 and that of the second layer 16. Specifically, the third layer is desirably formed to have a thickness within the range of 0.4 to 2.5 µm. If the nickel layer 17 is too thin, it is feared that the above mentioned surface oxidization preventing effect is insufficient. On the other hand, if the nickel layer 17 is too thick, sufficient surface oxidization preventing effect can be obtained but it is feared that productivity drops or costs rise.

As the metal material making the second layer 16, molybdenum is desirably selected. The reasons why molybdenum is selected are as follows. First, the adhesiveness between titanium and nickel is improved by interposition of molybdenum. Second, combination of nickel and molybdenum makes it possible to maintain the thickness of the resistance element 10 more easily than only use of nickel. Third, the specific resistance and sputtering rate of molybdenum are substantially equivalent to those of nickel.

In the above mentioned case, it is desirable that the molybdenum layer (Mo layer), which is the second layer, is formed to have a larger thickness than the first layer 15. Specifically, the molybdenum layer is desirably formed to have a thickness within the range of 0.5 to 7.0 µm. If the molybdenum layer 16 is too thin, it is feared that the improvement in adhesiveness between the first layer 15 and the third layer 17 and the maintenance of the thickness of the resistance element 10 cannot be sufficiently attained. On the other hand, if the molybdenum layer 16 is too thick, it is feared that productivity drops or costs rise.

The resistance element paste made of scaly noble metal powder is preferably made of one or more noble metal powders, an oxide and an organic vehicle.

The noble metal is preferably one or more kind(s) selected from gold, silver, platinum and palladium. The oxide is preferably at least one or more kind(s) selected from lead oxide, zinc oxide, silica, boron oxide and alumna. As the organic vehicle, cellulose acetate and the like can be used.

The resistance element paste made of scaly noble metal powder is oriented when it is printed. Therefore, the paste does not adhere easily to the mask.

The total thickness of the resistance element 10 is preferably from 1 to 500 µm. More preferably from 1 to 10 µm, still more preferably from 1 to 5 µm and most preferably from 2 to 4 µm. The reason of this is explained as follows. For instance, if the resistance element 10 is made thicker than is needed in the case of a physical film-depositing method, a total film-depositing period becomes long. As a result, it is feared that productivity drops or costs rise. On the other hand, if the resistance element 10 is too thin, the degree of the dispersion in the value of resistivity resulting from the dispersion in the thickness increases so that the performance of generating uniform heat cannot be sufficiently improved.

The resistance element having a thickness of 10 µm or less can be formed by printing a resistance paste or RF sputtering. In the case that the thickness is over 10 µm, a method of laminating a metal foil and the like can also be adopted. The metal foil has a small thickness dispersion and is profitable for the present invention.

As shown in FIGS. 1 to 3, base portions of the terminal pins 12 made of a conductive material are connected to pads 10a at two ends of the resistance element 10 with solder. Electrical conduction is attained between each of the terminal pins 12 and the resistance element 10. A socket 6a having a lead wire 6 is fitted onto the tip of each of the terminal pins 12. Therefore, when an electric current is supplied to the resistance element 10 through the lead wire 6 and the pin 12, the resistance element 10 generates heat so that the whole of the hot plate 3 is heated to about 150 to 200° C.

The following will briefly describe an example of the process for producing the hot plate 3.

If necessary, a sintering aid such as yttrium, a binder and so on are added to aluminum nitride powder to prepare a mixture. The mixture is homogeneously kneaded with a three-roll and the like to prepare a pasty kneaded product. This kneaded product is used as a raw material to produce a disc-like molded green product having a thickness of about 1 to 25 mm by press-molding.

The produced green molded product is subjected to punching or drilling to form holes. In this way, non-illustrated pin-inserting holes are formed. Next, the green molded product subjected to the hole-making step is dried, and subjected to pre-sintering and real sintering to sinter the product completely. In this way, the insulating substrate 9 made of aluminum nitride is produced. The sintering step is desirably carried out with a hot press machine, and the temperature in this step is desirably set to about 1500 to 2000° C.

Thereafter, the insulating substrate 9 made of aluminum nitride is cut out into a circular form having a given diameter (230 mmϕ in the present embodiment), and this is subjected to surface polishing processing, using a buffing machine and the like. At this time, a diamond grindstone is used as a grindstone to polish the substrate in the manner that the surface roughness Ra of the lower face 3b of the insulating substrate 9 is made to 1.0 $\mu$m or less. Namely, at this time, the lower face 3b is made to a mirror plane.

Subsequently, the whole of the lower face 3b, made to the mirror plane, of the insulating substrate 9 made of aluminum nitride is subjected to a film-depositing step based on a dry process. In the present embodiment, RF sputtering is adopted as one of film-depositing steps based on a dry process. More specifically, a device having both a high-frequency power source and a DC power source (a FR-DC coupled type bias sputtering device) is used to perform sputtering. At this time, titanium, molybdenum and nickel are sputtered in this order to laminate and form thin metal layers, which are three layers, on the lower face 3b of the substrate. Next, a resist having a given pattern is formed on the thin metal layers. With the resist on, etching is performed to form the resistance element 10 having a given shape and having a thickness dispersion of ±3 $\mu$m or less.

Thereafter, the terminals pins 12 are bonded to the respective pads 10a through solder S1. After the hot plate 3 is completed in this way, this is fitted into the opening 4 in the casing 2 so as to complete the desired hot plate unit 1 shown in FIG. 1.

The present invention will be more specifically described hereinafter.

BEST MODE FOR CARRYING OUT THE INVENTION (Production of Samples)

Here, according to the above mentioned process, four types of samples for tests, comprising the insulating substrate 9 made of aluminum nitride, were produced. In samples 1, 2 and 3 (Examples 1, 2 and 3), when the resistance element 10 having a three-layer structure and having a pattern width of 500 $\mu$m was formed by RF sputtering, the thickness of the whole thereof was set up to 3 $\mu$m. The thickness of a titanium layer, which was the first layer 15, that of a molybdenum layer, which was the second layer 16, and that of a nickel layer, which was the third layer 17, were set up to 0.2 $\mu$m, 2.0 $\mu$m, and 0.8 $\mu$m, respectively. In the surface polishing step before a film-depositing step, polishing was performed in the manner that the surface roughness Ra of the lower faces 3b of the substrates 9 (the value measured with a stylus type surface roughness meter (E-RCS01A made by Tokyo Seimitsu Co., Ltd.)) would be made to 0.5 $\mu$m, 0.1 $\mu$m and 0.03 $\mu$m in the samples 1, 2 and 3, respectively.

Furthermore, to 100 parts by weight of scaly silver powder (Ag-520, made by Showei Kogyou. Co), 7.5 parts by weight of metal oxides made of lead oxide, zinc oxide, silica, boron oxide and alumina (ratios by weight were 5/55/10/25/5) was added, to prepare a paste. This was printed on am aluminum substrate and sintered at 780° C. to obtain a hot plate as a sample 4 (Example 4).

On the other hand, in a sample 5 (Comparative Example 1) the resistance element 10 having a thickness of 6 $\mu$m was printed and formed on the lower face 3b of the insulating substrate 9 made of aluminum nitride, using a commonly used silver paste (Solvest PS603D, made by Tokuriki Kagaku Kenkyu-zyo). Its pattern form and pattern width were set in the same way as in Examples 1 to 3. In the surface polishing step before a film-depositing step, polishing was performed in the manner that the surface roughness Ra of the lower faces 3b of the substrates 9 would be made to about 3.0 $\mu$m.

(First Comparative Test)

Figure 5:
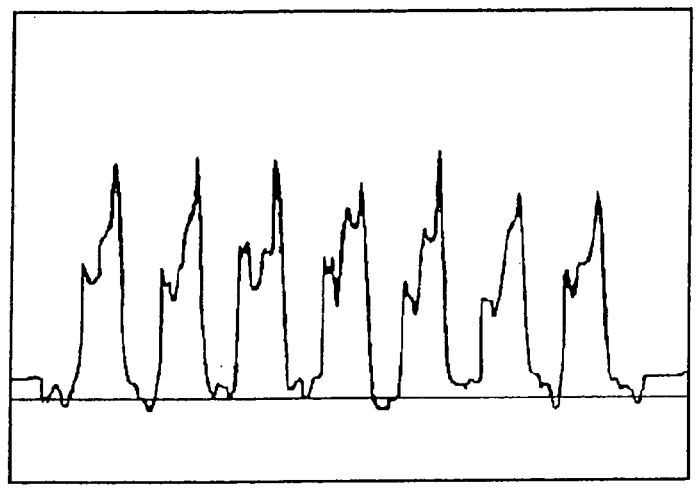
FIGS. 5(a) and (b) are graphs showing measurement results of the Ra values of conventional hot plates.
Figure 5:
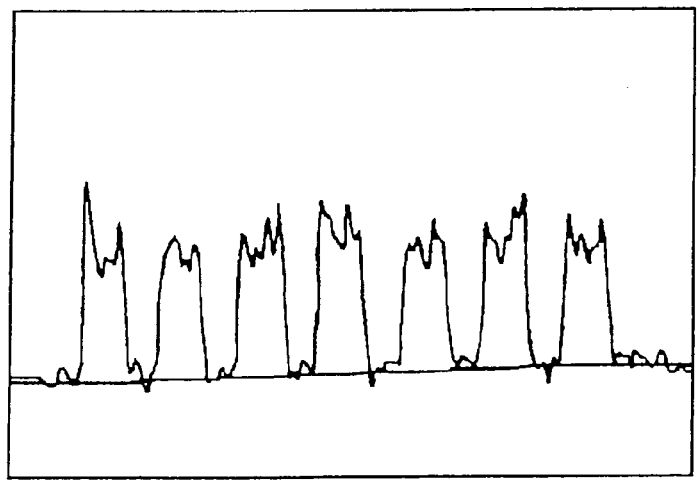

According to a method known in the prior art, the stylus type surface roughness meter was used to measure the values of the surface roughness Ra of the resistance elements 10 in the 5 samples. Graphs of FIGS. 4(a), 4(b) and 4(c) show measured data on the samples 1, 2 and 3, respectively. The above mentioned graphs of FIGS. 5(a) and 5(b) show measured data on the sample 5. As a result, the measured values of the samples 1 to 3 were evidently smaller than the measured value of the sample 5. Namely, the thickness dispersions of the resistance elements 10 of the samples 1 to 3 were ±1 $\mu$m or less, and were +0.7 $\mu$m, +0.5 $\mu$m, and −0.3 $\mu$m, respectively. It was demonstrated that these thickness dispersions were far smaller than the thickness dispersion (+3.1 $\mu$m) in the resistance element 10 of the sample 5. The thickness dispersion of the sample 4 was +2.0 $\mu$m. It was also demonstrated that as the surface roughness Ra of the lower face 3b of the substrate 9 was smaller, the thickness dispersion of the resistance element 10 was smaller. The values of Ra of the samples 1 to 5 were 0.5 $\mu$m, 0.1 $\mu$m, 0.03 $\mu$m, 0.5 $\mu$m and 2.1 $\mu$m, respectively.

(Second Comparative Test)

The respective samples 1 to 5 were perpendicularly cut along the thickness direction of their substrates, and the cut surfaces of the resistance elements 10 were observed with an optical microscope. As a result, the resistance elements 10 of the samples 1 to 3 had a dense structure which hardly had defects therein. On the other hand, in the samples 4 and 5 defects were partly generated in the resistance element 10. The samples 4 and 5 were poorer than the samples 1 to 3 in denseness.

(Third Comparative Test)

Next, these 5 insulating substrates 9 made of aluminum nitride were used to make hot plate units 1. In the state that the semiconductor wafer W1, which was an object to be heated, was put on each of the substrates, the wafer was actually heated. As the semiconductor wafer W1, a commercially available test wafer wherein temperature sensors (thermocouples) were beforehand embedded in plural positions was used.

In this test, the hot plate 3 was heated to the set temperature (180° C. herein) by sending an electric current into the resistance element 10. In the state that the rate of temperature increase became about zero, the temperatures at the respective positions were measured with a thermo viewer (IR-162012-0012, made by Nippon Datum. Co) and the difference between the maximum value and the minimum value thereof (the value of the dispersion in the temperature) was calculated.

As a result, the values of the dispersion in the temperature were within 0.2° C., 0.15° C., 0.1° C., and 0.25° C. in the test wafers of the samples 1, 2, 3 and 4, respectively. Namely, it was demonstrated that as the surface roughness Ra of the lower face 3b of the insulating substrate 9 was smaller, the dispersion in the temperature in the test wafer was smaller. On the other hand, the value of the dispersion in the temperature in the sample 5 was 0.4° C. or less, and was evidently poorer than the results of the samples 1 to 4. Not only on the test wafer side but also on the side of the insulating substrate 9, multipoint-temperature-measurement was performed, so that substantially the same tendency as the above was recognized. The temperature was raised to 400° C., so that the values were 7° C., 6° C., 4° C., 7° C. and 10° C. in the samples 1, 2, 3, 4 and 5, respectively.

Accordingly, the following effects can be obtained according to the respective examples of the present embodiments.

(1) In this hot plate 3, the thickness dispersion of the resistance element 10 formed on the insulating substrate 9 made of aluminum nitride is ±3 $\mu$m or less and is smaller than conventional ones. For this reason, the dispersion in the value of resistivity inside the resistance element 10 is small so that the dispersion in the calorific value inside the resistance element 10 is small. As a result, it is possible to realize the hot plate 3 that can heat the semiconductor wafer W1 uniformly, namely, the hot plate 3 that is superior in the performance of generating uniform heat.

(2) When this hot plate 3 for heating a wafer is used, finally a semiconductor chip having a high quality can be effectively produced.

(3) In the respective examples of the present embodiment, a surface polishing processing step before a film-depositing step is carried out to set the surface roughness Ra of the lower face 3b of the insulating substrate 9 made of aluminum nitride to 2.0 $\mu$m or less. Therefore, the thickness dispersion of the resistance element 10 can be still more reduced. The execution of such processing results in a greater improvement in the performance of generating uniform heat.

(4) In this hot plate 3, the substrate 9 made of aluminum nitride is used. Therefore, the influence coming from the dispersion in heat-generating temperature of the resistance element 10 can be cancelled out to some extent by high thermal conductivity of the substrate 9 itself. In other words, the selection of the substrate 9 made of aluminum nitride contributes to a greater improvement in the performance of generating uniform heat.

(5) When the resistance element 10 having a three-layer structure made of titanium, molybdenum and nickel is formed in this hot plate 3, the total thickness thereof, and the thickness of layers 15, 16 and 17 are set within the above mentioned ranges. Therefore, the resistance element 10 superior in the performance of generating uniform heat, adhesiveness and so on can be formed without damaging productivity or costs.

(6) In the respective Examples of the present embodiment, the resistance element 10 is formed by RF sputtering, which is one of physical film-depositing methods. For this reason, the thickness dispersion of the obtained resistance element 10 is very small. The resistance element 10 becomes denser as compared with film-depositing methods based on a wet process, such as plating. Thus, inner defects are not easily generated. As a result, the dispersion in the value of resistivity is very small so that the dispersion in the calorific value inside the resistance element 10 becomes very small and the performance of generating uniform heat can by highly improved. The resistance element 10 that is not easily exfoliated can be obtained since the adhesiveness of the resistance element 10 to the insulating substrate 9 becomes very high. In short, if this production process is carried out, the above mentioned excellent hot plate 3 can be easily and surely obtained.

The embodiment of the present invention may be modified as follows.

The resistance element 10 is not limited to the three-layer structure, and may be two-layer structure or a multilayer structure having four or more layers. The resistance element 10 may be made into a monolayer structure. The material of the first sputtered layer 15 in the embodiment may be changed from titanium to chromium.

The process for forming the resistance element 10 is not limited to the above mentioned manner, and may be as follows. A film made of a material for resists is first formed on the whole of the lower face 3b of the aluminum nitride substrate 9 by RF sputtering. Next, openings are made into a pattern at given positions of the film. The openings correspond to positions where the pieces of the resistance element 10 are to be formed. Next, a thin metal layer is formed on the resist by RF sputtering. Thereafter, the resist that has become unnecessary is exfoliated. By this method, the resistance element 10 can be easily and surely formed.

The thin metal layer constituting the resistance element 10 may be formed by a method other than RF sputtering, for example, ECR sputtering, bipolar sputtering, magnetron sputtering and the like. As the film-depositing method based on a dry process other than sputtering, it is allowable to adopt, for example, a physical film-deposition method such as ion plating, a cluster ion beam process, vacuum deposition or PVD, or a chemical film-deposition method, such as CVD.

The surface polishing processing onto the insulating substrate before the film-depositing step may be omitted if it is unnecessary.

The product to be heated is not limited to the semiconductor wafer W1, and may be a product other than it.

INDUSTRIAL APPLICABILITY

As described above in detail, according to the present invention, it is possible to provide a hot plate making it possible to heat an object to be heated uniformly.

According to the production process, the performance of generating uniform heat can be improved without damaging productivity or costs.

It is also possible to provide a resistance element superior in performance of generating uniform heat, adhesiveness and so on, without damaging productivity or costs.

What is claimed is:

1. A hot plate for heating a wafer comprising a ceramic substrate, said ceramic substrate having a lower face having a surface roughness of 2 $\mu$m or less and an upper face,
    wherein a resistance element pattern having a thickness dispersion of ±3 $\mu$m or less is formed on the lower face of the ceramic substrate; and
    wherein said resistance element comprises first layer comprising titanium; a second layer comprising molybdenum and having a larger thickness than said first layer, on said first layer; and a third layer comprising nickel and having an intermediate thickness between the thickness of said first layer and that of said second layer, on said second layer.

2. The hot plate according to claim 1, wherein the thickness dispersion of the resistance element is ±1 $\mu$m or less.

3. The hot plate according to claim 1, wherein the thickness of said resistance element is from 0.5 to 500 $\mu$m.

4. The hot plate according to claim 1, wherein the thickness of said resistance element is from 1 to 10 $\mu$m.

5. The hot plate according to claim 1, wherein said ceramic substrate is at least one kind selected from a nitride ceramic and a carbide ceramic.

6. The hot plate according to claim 1, wherein said titanium layer has a thickness of 0.1 to 0.5 µm, a said molybdenum layer has a thickness of 0.5 to 7.0 µm, on said titanium layer, and said nickel layer has a thickness of 0.4 to 2.5 µm, on said molybdenum layer.

7. A process comprising heating a wafer with the hot plate according to claim 1.

8. A hot plate for heating a wafer comprising a ceramic substrate, said ceramic substrate having a lower face having a surface roughness of 2 µm or less and an upper face, wherein
a resistance element pattern having a thickness dispersion of ±3 µm or less is formed on the lower face of the ceramic substrate,
the thickness dispersion being the larger of the absolute value of Tmax−Tav and the absolute value of Tmin−Tav, Tav being an average thickness obtained by averaging thicknesses of arbitrarily selected 10 points of the resistance element, Tav being within a range of 3 to 500 µm, Tmax being the maximum thickness of said 10 points, and Tmin being the minimum thickness of said 10 points.

9. The hot plate according to claim 8,
wherein the thickness dispersion of the resistance element is ±1 µm or less.

10. The hot plate according to claim 8,
wherein the thickness of said resistance element is from 0.5 to 500 µm.

11. The hot plate according to claim 8,
wherein the thickness of said resistance element is from 1 to 10 µm.

12. The hot plate according to claim 8,
wherein said ceramic substrate is at least one kind selected from a nitride ceramic and a carbide ceramic.

13. The hot plate according to claim 8,
wherein said resistance element has a multilayer structure, and among a plurality of layers constituting said resistance element, the layer nearest to the substrate comprises titanium or chromium.

14. The hot plate according to claim 8,
wherein said resistance element comprises a first layer comprising titanium; a second layer comprising molybdenum and having a larger thickness than said first layer, on said first layer; and a third layer comprising nickel and having an intermediate thickness between the thickness of said first layer and that of said second layer, on said second layer.

15. The hot plate according to claim 8,
wherein said resistance element comprises a titanium layer having a thickness of 0.1 to 0.5 µm, a molybdenum layer having a thickness of 0.5 to 7.0 µm, on said titanium layer, and a nickel layer having a thickness of 0.4 to 2.5 µm, on said molybdenum layer.

16. The hot plate according to claim 8,
wherein said resistance element pattern is formed by a dry process.

17. The hot plate according to claim 16,
wherein the thickness dispersion of the resistance element is ±1 µm or less.

18. The hot plate according to claim 16,
wherein the thickness of said resistance element is from 0.5 to 500 µm.

19. The hot plate according to claim 16,
wherein the thickness of said resistance element is from 1 to 10 µm.

20. The hot plate according to claim 16,
wherein said ceramic substrate is at least one kind selected from a nitride ceramic and a carbide ceramic.

21. The hot plate according to claim 16,
wherein said dry process is RF sputtering.

22. The hot plate according to claim 8,
wherein said resistance element pattern is made of scaly noble metal powder.

23. The hot plate according to claim 22,
wherein the thickness dispersion of the resistance element is ±1 µm or less.

24. The hot plate according to claim 22,
wherein the thickness of said resistance element is from 0.5 to 500 µm.

25. The hot plate according to claim 22,
wherein the thickness of said resistance element is from 3 to 10 µm.

26. The hot plate according to claim 22,
wherein said ceramic substrate is at least one kind selected from a nitride ceramic and a carbide ceramic.

27. A process comprising heating a wafer with the hot plate according to claim 8.

28. A process for producing the hot plate as claimed in claim 8, which comprises:
forming said resistance element by a film-depositing method based on a dry process.

29. A process for producing the hot plate as claimed in claim 8, which comprises:
forming said resistance element by RF sputtering.

30. A process for producing the hot plate as claimed in claim 8, which comprises:
printing a resistance element paste made of scaly noble metal powder and firing the paste.

* * * * *